US008310885B2

(12) United States Patent
Cases et al.

(10) Patent No.: US 8,310,885 B2
(45) Date of Patent: Nov. 13, 2012

(54) MEASURING SDRAM CONTROL SIGNAL TIMING

(75) Inventors: Moises Cases, Austin, TX (US); Vinh B. Lu, Austin, TX (US); Bhyrav M. Mutnury, Austin, TX (US); James J. Parsonese, Durham, NC (US); Nam H. Pham, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/768,998

(22) Filed: Apr. 28, 2010

(65) Prior Publication Data

US 2011/0267906 A1    Nov. 3, 2011

(51) Int. Cl.
*G11C 7/00* (2006.01)
(52) U.S. Cl. ................................ 365/191; 365/205
(58) Field of Classification Search .................. 365/191, 365/205
See application file for complete search history.

(56) References Cited

U.S. PATENT DOCUMENTS

| 6,137,734 A | 10/2000 | Schoner et al. |
| 6,496,953 B1 | 12/2002 | Helland |
| 6,920,526 B1 | 7/2005 | Sikkink et al. |
| 7,042,799 B2 | 5/2006 | Cho |
| 2003/0191995 A1* | 10/2003 | Abrosimov et al. .......... 714/719 |
| 2004/0223577 A1* | 11/2004 | Watanabe et al. ............. 375/376 |
| 2007/0047337 A1* | 3/2007 | Iizuka ........................... 365/193 |
| 2007/0192610 A1* | 8/2007 | Chun et al. .................... 713/176 |
| 2008/0239844 A1* | 10/2008 | Carnevale et al. ............ 365/193 |
| 2009/0013228 A1* | 1/2009 | Jarboe, Jr. et al. ............ 714/733 |
| 2009/0113558 A1* | 4/2009 | Prabhakaran et al. .......... 726/27 |
| 2010/0082967 A1* | 4/2010 | Lo ................................... 713/2 |

FOREIGN PATENT DOCUMENTS

| JP | 2001324549 A | 11/2001 |
| JP | 2002156423 A | 5/2002 |
| JP | 2005300436 A | 10/2005 |
| JP | 2007213055 A | 8/2007 |
| JP | 2008077305 A | 4/2008 |

OTHER PUBLICATIONS

Koehler, et al.; Performance Analysis Challenges and Framework for High-Performance Reconfigurable Computing; University of Florida; USA, Mar. 18, 2008.

* cited by examiner

*Primary Examiner* — Michael Tran
(74) *Attorney, Agent, or Firm* — Edward J. Lenart; Cynthia G. Seal; Biggers & Ohanian, LLP

(57) ABSTRACT

Measuring control signal timing for synchronous dynamic random access memory ('SDRAM'), including combining into a trigger signal for an oscilloscope display control signals of an SDRAM under test, the control signals derived only from a single type of memory operations; and driving, continually during both READ and WRITE operations to and from the SDRAM under test, the oscilloscope display with a memory bus data signal ('DQ') and a memory bus clock signal ('DQS') from the SDRAM under test.

16 Claims, 6 Drawing Sheets

PRIOR ART    FIG. 1

MEASURING SDRAM CONTROL SIGNAL TIMING

BACKGROUND OF THE INVENTION

1. Field of the Invention

The field of the invention is data processing, or, more specifically, methods and apparatus for measuring control signal timing for synchronous dynamic random access memory ('SDRAM').

2. Description of Related Art

The SDRAM memory bus is a synchronous bus having both data signals and clock signals. Data signals are called 'DQ,' and the clock is called a 'strobe' and labeled 'DQS' to differentiate it from the system clock signal which is also one of the SDRAM control signals. The SDRAM memory bus is bidirectional, driven by a memory controller during READ operations, driven by the SDRAM during WRITEs. The timing relationship between DQ and DQS is part of the official JEDEC SDRAM specification, therefore always a subject of test. This timing relationship, however, is very difficult to measure in test because the timing between DQ and DQS varies between READ and WRITE operations. In READs, the memory controller drives the DQS signal in phase with the DQ signal. In WRITEs, the SDRAM device drives the DQS signal out of phase with the DQ signal. When a sequence of READ and WRITE operations is captured and displayed on a test oscilloscope, therefore, the result is the jumbled, difficult-to-read display illustrated in FIG. 1.

FIG. 1 sets forth a line drawing of a test oscilloscope (118) with an oscilloscope display (120) upon which are shown test traces for DQ (102) and DQS (104), with the traces so overlapping and jumbled that it is not possible to measure the control signal timing. In FIG. 1, the scope trace and capture is triggered on a system clock, which is also an SDRAM bus control signal, and the signals captured, in addition to the memory bus signal DQS, include a test sequence of DQ data signals that includes both READ operations and WRITE operations. The oscilloscope (118) therefore captures and displays both phases of DQS, one for READs and one for WRITES as well as two phases of DQ. The result is the difficulty shown.

Prior art clarifies the scope display by writing a program to loop a series of consecutive READ operations only or a series of consecutive WRITE operations only while performing timing measurements. Looping only WRITE or only READ operations, however, risks missing signal quality issues that exist only during bus turn around time from WRITE to READ or from READ to WRITE. Prior art has also attempted to clarify the test display by using a separate logic analyzer to separate the signals, but this approach requires additional, expensive equipment and expertise.

SUMMARY OF THE INVENTION

Method and apparatus for measuring control signal timing for synchronous dynamic random access memory ('SDRAM'), including combining into a trigger signal for an oscilloscope display control signals of an SDRAM under test, the control signals derived only from a single type of memory operations; and driving, continually during both READ and WRITE operations to and from the SDRAM under test, the oscilloscope display with a memory bus data signal ('DQ') and a memory bus clock signal ('DQS') from the SDRAM under test.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 2:
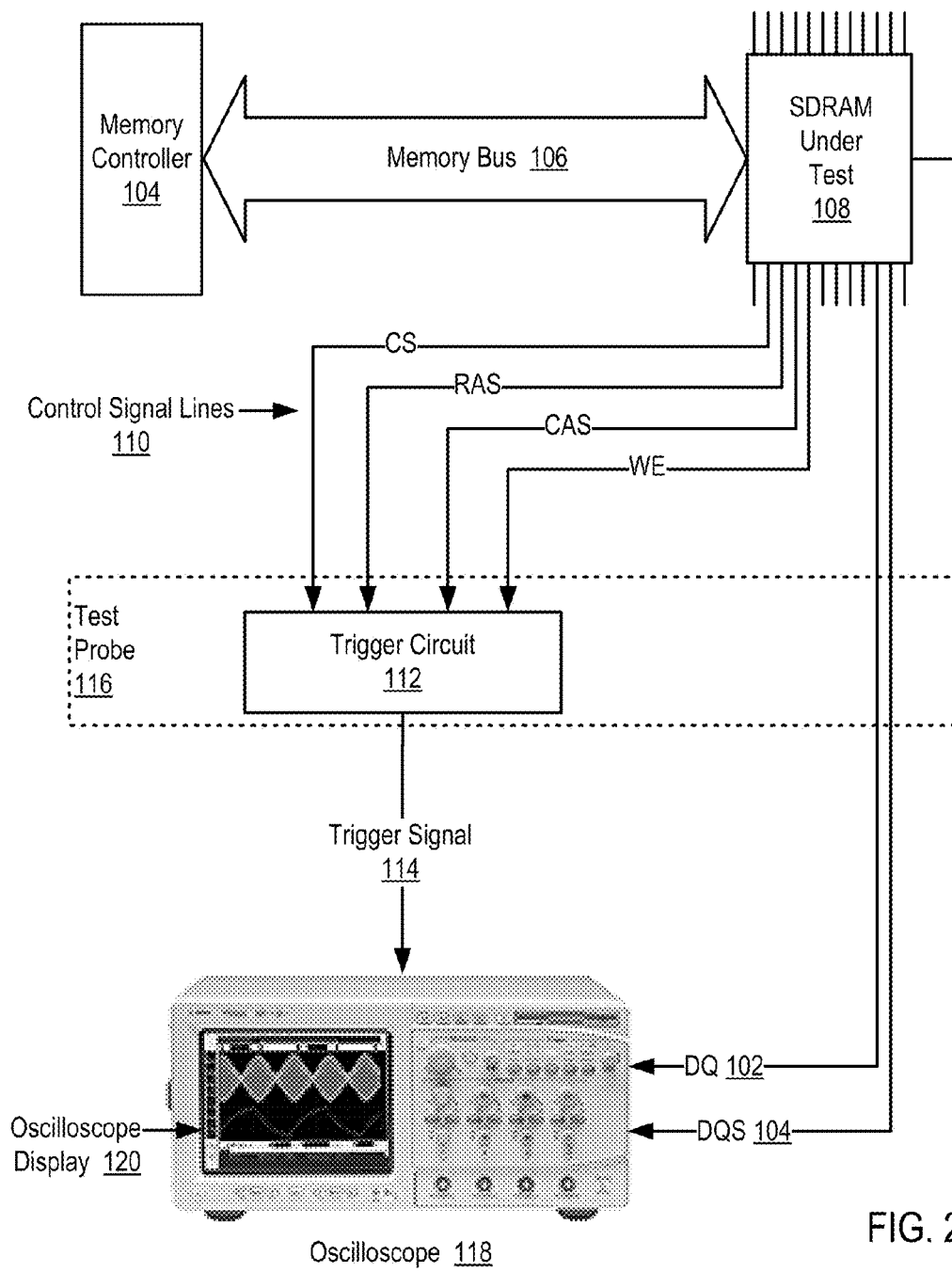
FIGS. 2 and 3 set forth line drawings of example apparatus that measures control signal timing for SDRAM according to embodiments of the present invention.

Example apparatus and methods for measuring control signal timing for synchronous dynamic random access memory ('SDRAM') in accordance with embodiments of the present invention are described with reference to the accompanying drawings, beginning with FIG. 2. FIG. 2 sets forth a line drawing of example apparatus that measures control signal timing for SDRAM according to embodiments of the present invention. The apparatus of FIG. 2 includes a memory controller coupled through a memory bus (106) to an SDRAM (108) under test. The memory controller (104) is a digital circuit which manages the flow of data going to and from the SDRAM. It can be a separate chip or integrated into another chip, such as on the die of a microprocessor. Computers using Intel microprocessors have traditionally had a memory controller implemented on their motherboard's northbridge, but some modern microprocessors, such as DEC/Compaq's Alpha 21364™, AMD's Athlon 64™ and Opteron™ processors, IBM's POWER5™, Sun Microsystems UltraSPARC T1™ and more recently, Intel Core i7™ have a memory controller manufactured directly onto the microprocessor die. The memory bus (106) is composed of all the signal lines needed to control the SDRAM and move digital data between the memory controller (104) and the SDRAM (108). The exact composition of the memory bus can vary among different types of SDRAM, but typically includes, for example, lines such as a system clock line, data lines labeled DQ, a memory bus clock or 'strobe' labeled DQS, Chip Select ('CS'), Write Enable ('WE'), Column Address Strobe ('CAS'), Row Address Strobe ('RAS'), Clock Enable ('CKE'), Bank Select ('BA'), or Data Mask ('DQM').

The SDRAM is a kind of dynamic random access memory. Dynamic random access memory or 'DRAM' is a type of random access memory that stores each bit of data in a separate capacitor within an integrated circuit. Because capacitors leak charge, the stored data eventually fades unless the capacitor charge is refreshed periodically. Because of this refresh requirement, the memory is referred to as 'dynamic' memory as opposed to various forms of static memory. Synchronous dynamic random access memory or 'SDRAM' is DRAM with a synchronous interface. DRAM typically has an asynchronous interface, to that it responds as quickly as possible to changes in control inputs. SDRAM has a synchronous interface, meaning that it waits for a clock signal before responding to control inputs and is therefore synchronized with the computer's system bus—which in fact is typically included among memory bus signals for SDRAM. The system clock is used to drive an state machine in SDRAM chips that pipelines incoming instructions, which allows SDRAM to have a more complex pattern of operation than a typical DRAM with no synchronized interface. Pipelining means that SDRAM can accept a new instruction before it has finished processing a previous instruction. In a pipelined WRITE, the WRITE command can be immediately followed by another instruction without waiting for data actually to be written to memory. In a pipelined READ, the requested data appears after a fixed number of clock cycles after the READ instruction is received by an SDRAM chip, cycles during which additional instructions can be sent. This delay is referred to as 'latency.'

The apparatus in the example of FIG. 2 includes a test oscilloscope (118) that is connected through a test probe (116) to the SDRAM (108) under test. The test probe (116) connects from the SDRAM (108) to the oscilloscope (118) DQ (102), DQS (104), and a trigger signal (114). The trigger signal (112) is developed from the control signals CS, RAS, CAS, and WE which are conducted through several control signal lines (110) to a trigger circuit (112) in the test probe (116). The trigger circuit includes a network of combinatorial logic that combines the control signals from the SDRAM into a trigger signal for the oscilloscope display. The trigger circuit combines control signals that are derived only from a single type of memory operations, either READ operations only or WRITE operations only. The memory controller (104) and the SDRAM (108) under test drive the oscilloscope display (120) with the memory bus data signal DQ (102) and the memory bus clock signal DQS (104) from the SDRAM under test, and they drive DQ and DQS to the oscilloscope continually during both READ and WRITE operations to and from the SDRAM under test. That is, the trigger signal (114) is derived from control signals occurring during only READs or only WRITES, whereas the DQ and DQS signals whose timing is to be measured on the scope are driven continually by a test pattern or test sequence that includes both READs and WRITEs. The trigger signal is based on READS only or WRITES only; DQ and DQS are from a series including both READs and WRITEs. The result is to clarify the display by triggering the display with a trigger signal that is perfectly in phase with either the READs or the WRITEs—depending on which mode is selected—as illustrated and explained in more detail below with reference to FIG. 6.

Figure 3:
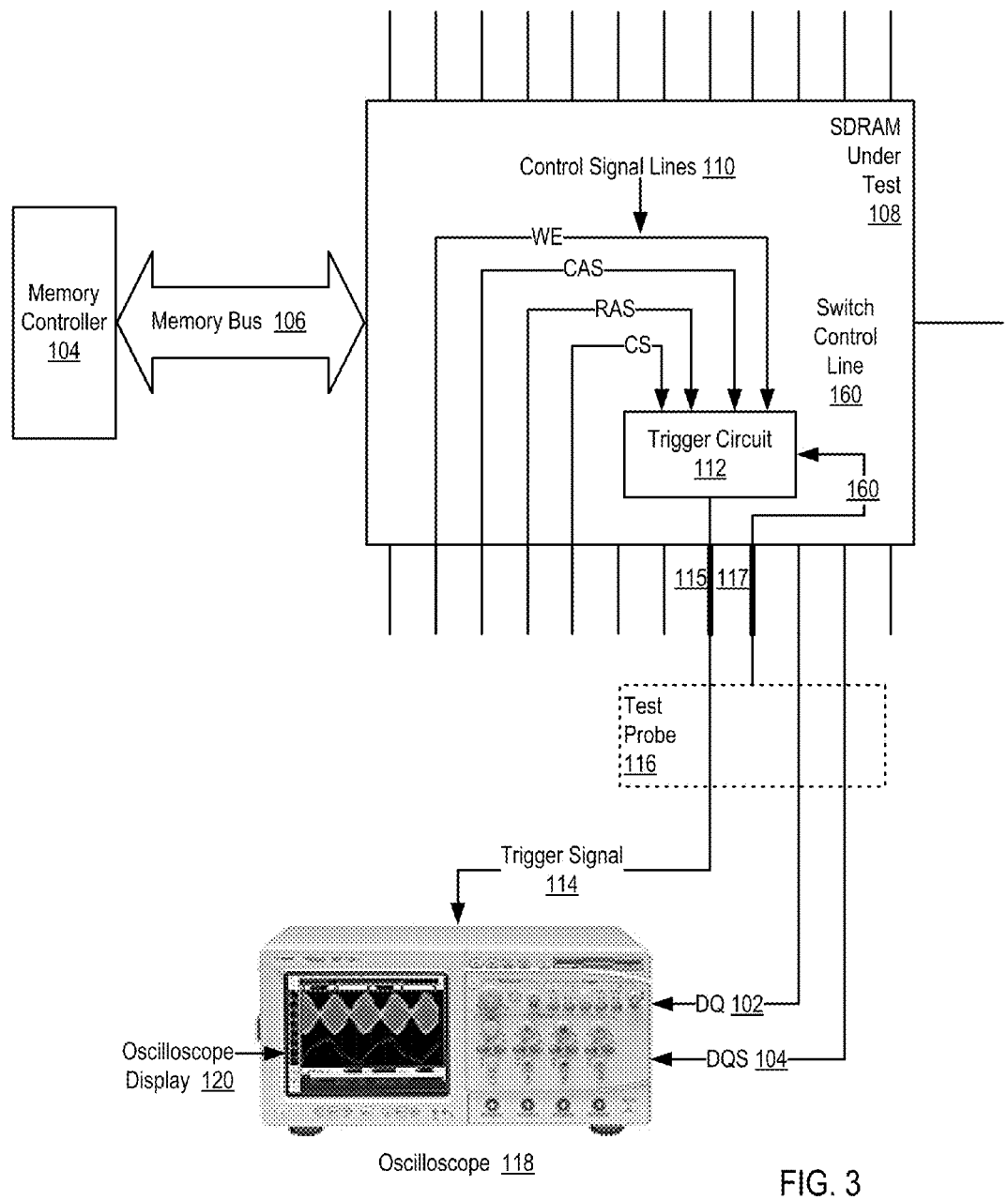

For further explanation, FIG. 3 sets forth a line drawing of further example apparatus that measures control signal timing for SDRAM according to embodiments of the present invention. The apparatus in the example of FIG. 3 is very similar to the apparatus in the example of FIG. 2 and functions in very much the same way, although its structure is somewhat different. The trigger circuit (112) combines the control signals WE, CAS, RAS, and CS from the control signal lines (110) just as in the example of FIG. 2, using control signals derived only from a single type of memory operations, either READs only or WRITES only. The memory controller (104) and the SDRAM (108) under test drive the oscilloscope display (120) with the memory bus data signal DQ (102) and the memory bus clock signal DQS (104) from the SDRAM under test, and they drive DQ and DQS to the oscilloscope continually during both READ and WRITE operations to and from the SDRAM under test.

In the example of FIG. 3, however, the trigger circuit, which was installed in the test probe in the example of FIG. 3, is now manufactured directly into SDRAM under test as part of the internal circuitry of the SDRAM. In the example of FIG. 3, one of the external connectors (115) of the SDRAM is dedicated to the trigger signal (114), and only three signal lines (102, 104, 114) need be brought from the SDRAM to the test probe—contrasted with six lines between the SDRAM and the test probe in the example of FIG. 2—evidencing a simpler test setup in the example of FIG. 3 as well as simpler internal structure of the test probe (116). Readers will recognize that in another embodiment (not shown), the trigger circuit (108) is installed in the oscilloscope (118) itself, requiring the test probe to bring all the way to the scope all the control lines whose signal are combined into the trigger signal—evidencing a somewhat more complex test setup—although both the probe (116) and the SDRAM (108) in such an embodiment have simpler internal circuitry.

Figure 4A:
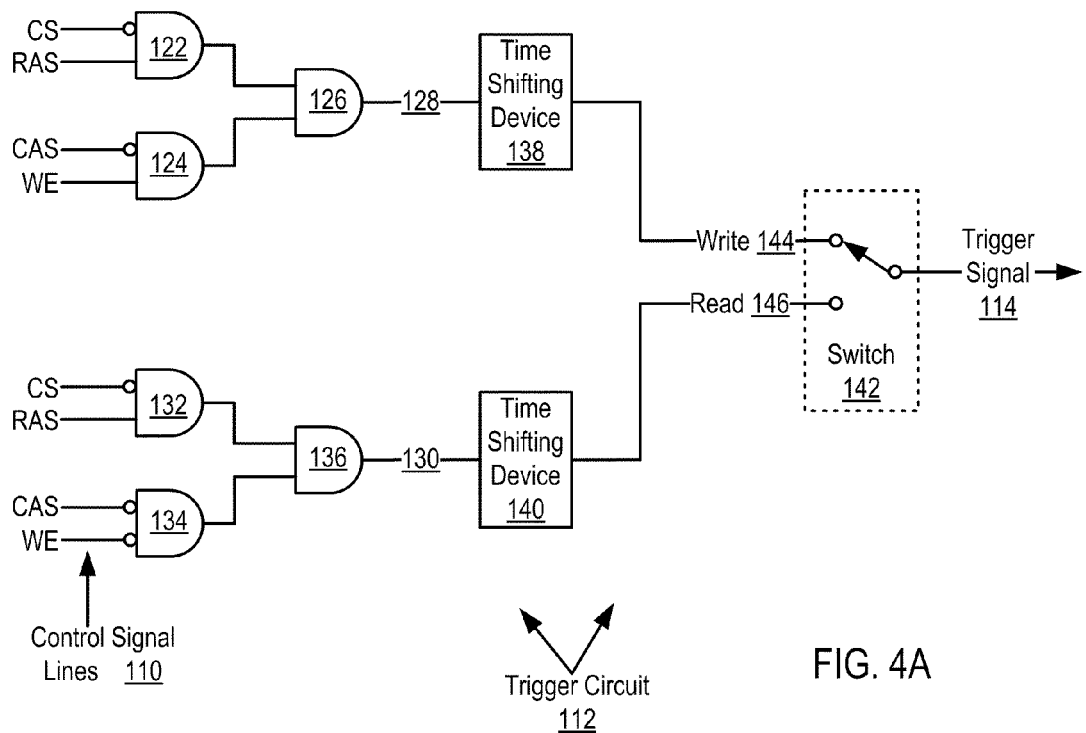
FIG. 4A illustrates an example trigger circuit useful in measuring SDRAM control signal timing according to embodiments of the present invention.

For further explanation, FIG. 4A sets forth an example trigger circuit (112) that combines into a trigger signal (114) for an oscilloscope display control signals of an SDRAM under test, with the control signals derived only from a single type of memory operations. The trigger circuit of FIG. 4A is designed to combine control signals for the SDRAM instructions described in Table 1.

TABLE 1

SDRAM INSTRUCTION CHART

| Instruction | Signal | | | |
| --- | --- | --- | --- | --- |
| | CS | RAS | CAS | WE |
| Device Deselected | H | X | X | X |
| Mode Register Set | L | L | L | L |
| Refresh | L | L | L | H |
| Refresh Exit | L | H | H | H |
| ZQ Calibration | L | H | H | L |
| Precharge | L | L | H | L |
| Bank Active | L | L | H | H |
| Read | L | H | L | L |
| Write | L | H | L | H |

As shown in Table 1, READ operations for the SDRAM whose instruction are specified by Table 1 are defined as CS low, RAS high, CAS low, WE high, and WRITE operations are defined as CS low, RAS high, CAS low, WE high. The timing sequence for such an SDRAM is that CS, WE, and RAS are set when CAS transitions. In addition, the SDRAM reads and writes data across columns in a row, so that column information is reset more frequently that row information. What is transmitted through the trigger circuit as a trigger signal, therefore, is in effect a sequence of CAS transitions, high to low when column data is valid, low to high to wait for new column data to become valid, and so on.

In the trigger circuit (112) of FIG. 4A, AND gates (122, 124, 126) combine control signals into a trigger signal only for WRITE operations, because gates (124, 126) are active only when WE is high. Gates (122, 124, 126) combine control signals into a trigger signal according to the logic function, which describes the signal at test point (128) as a function of the input control signals: (NOT CS) AND RAS AND (NOT CAS) AND WE. Gates (132, 134, 136) combine control signals into a trigger signal only for READ operations, because gates (134, 136) are active only when WE is low. Gates (132, 134, 136) combine control signals into a trigger signal according to the logic function, which describes the signal at test point (130) as a function of the input control signals: (NOT CS) AND RAS AND (NOT CAS) AND (NOT WE).

The trigger circuit (112) of FIG. 4A includes a time shifting device (138), which adjusts the trigger signal (114) for the latency effects of SDRAM access times by time-shifting the trigger signal. Devices that are useful or that can be adapted to be useful as a time shifting device for measuring SDRAM control signal timing according to embodiments of the present invention include shift registers, delay lines, phase locked loops, and delay locked loops, and others that will occur to those of skill in the art. To the extent that a latency can be measured as an integral number of trigger signal cycles, then a shift register with the same integral number of shift stages may be the preferred circuit. To the extent that the delay needs to represent fractional portions of a trigger signal cycle, a delay line or delay locked loop may be preferred.

The trigger circuit (112) of FIG. 4A includes a switch (142) whose setting determines the single type of memory operations from which the trigger signal (114) is derived. When the switch (142) is set to position (144), WRITE operations are the single type of memory operations from which the trigger signal (114) is derived. When the switch (142) is set to position (146), READ operations are the single type of memory operations from which the trigger signal (114) is derived.

Figure 4B:
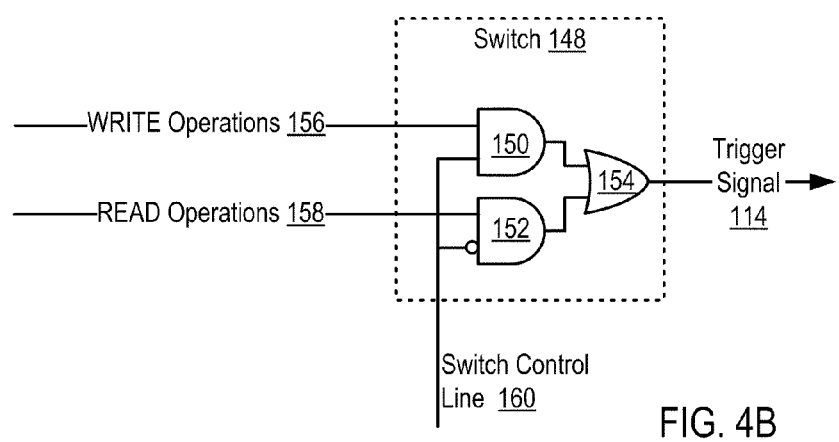
FIG. 4B illustrates an electronic switch circuit useful in measuring SDRAM control signal timing according to embodiments of the present invention.

The switch (142) in FIG. 4A is represented as electromechanical in structure, as might be mounted on a housing of a test probe, for example, although such structure is merely optional. FIG. 4B illustrates an alternative form of switch, an electronic switch (148) that performs, under control of signal values on a switch control line (160), the same function of determining the single type of memory operations from which the trigger signal (114) is derived. When the switch control line (160) is high, AND gate (150) and OR gate (154) determine that WRITE operations (156) are the single type of memory operations from which the trigger signal (114) is derived. When the switch control line (160) is low, AND gate (152) and OR gate (154) determine that READ operations (158) are the single type of memory operations from which the trigger signal (114) is derived. Embodiments like those illustrated and explained with reference to FIG. 3, in which the trigger circuit (112) is installed in the SDRAM (108) can use a electronic switch like switch (148) to determine the single type of memory operations from which the trigger signal (114) is derived, adding the switch control line (160 on FIG. 3) through an additional one of the external connectors (117 on FIG. 3) of the SDRAM (108 on FIG. 3) from the test probe (116) to the trigger circuit (112 on FIG. 3)

Figure 5:
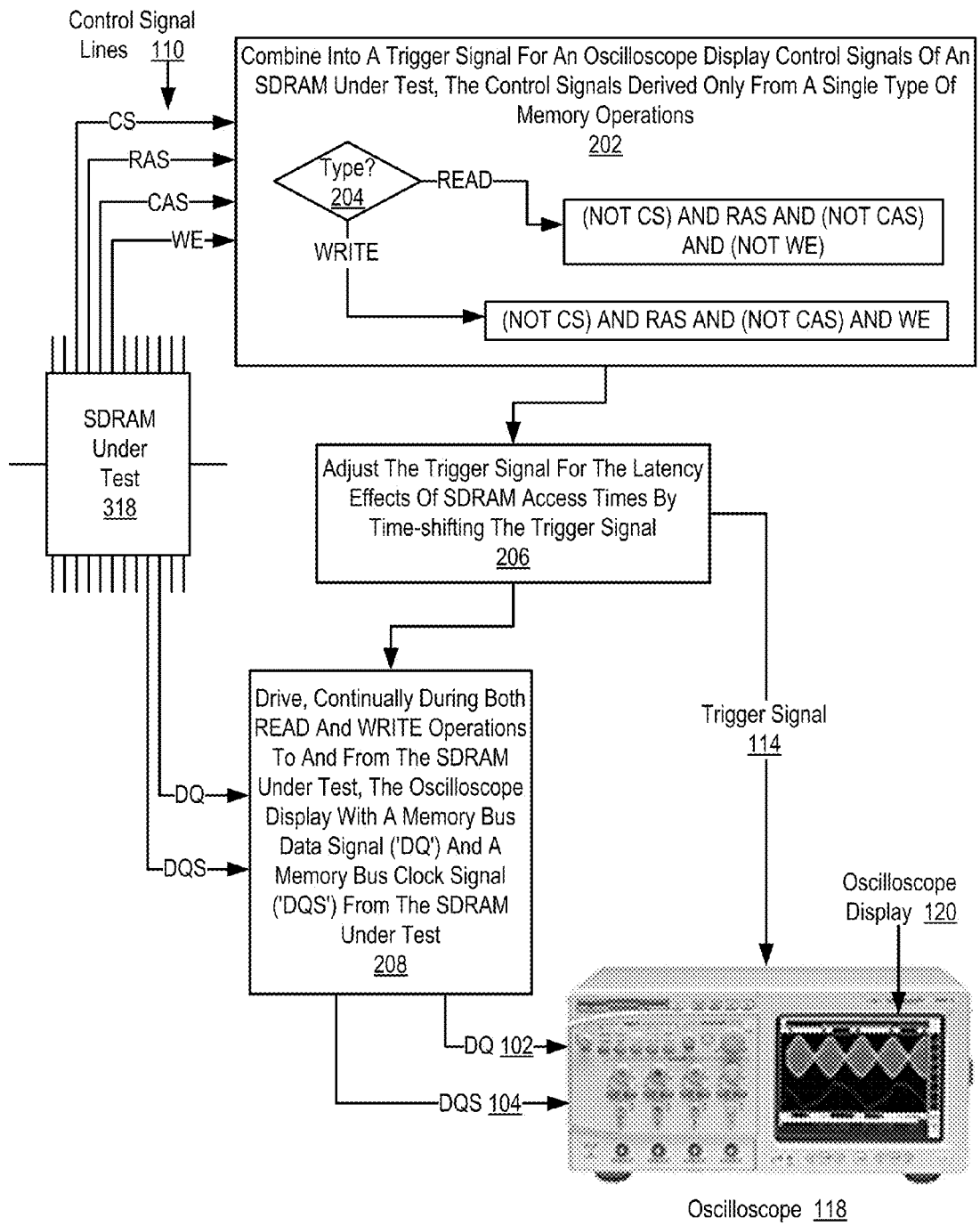
FIG. 5 sets forth a flow chart illustrating an example method of measuring SDRAM control signal timing according to embodiments of the present invention.

For further explanation, FIG. 5 sets forth a flow chart illustrating an example method of measuring SDRAM control signal timing according to embodiments of the present invention. The method of FIG. 5 includes combining (202) into a trigger signal (114) for an oscilloscope display (120) control signals of an SDRAM (318) under test. The control signals are derived only from a single type of memory operations, either READs only or WRITES only. In the example of FIG. 5, the control signals include Chip Select (CS), Write Enable (WE), Column Address Strobe (CAS), and Row Address Strobe (RAS). In the method of FIG. 5, combining (202) control signals includes determining (204) the single type of memory operations from which the control signals are derived. When the single type of memory operations consists of READ operations, combining (202) the control signals includes combining the SDRAM control signals according to: (NOT CS) AND RAS AND (NOT CAS) AND (NOT WE). When the single type of memory operations consists of WRITE operations, combining (202) the control signals includes combining the SDRAM control signals according to: (NOT CS) AND RAS AND (NOT CAS) AND WE. Combining (202) the control signals in some embodiments is carried out by combinatorial logic installed in a test probe— in other embodiments by combinatorial logic manufactured into the SDRAM under test—and in other embodiments by combinatorial logic manufactured into the oscilloscope (118).

The method of FIG. 5 also includes adjusting (206) the trigger signal for the latency effects of SDRAM access times by time shifting the trigger signal. Time shifting the trigger signal is carried out in some embodiments by a shift register, in other embodiments by a delay line, in other embodiments by a phase locked loop, and in other embodiments by a delay locked loop. Other means of time shifting the trigger signal may occur to those of skill in the art, and all such means are within the scope of the present invention.

The method of FIG. 5 also includes driving (208), continually during both READ and WRITE operations to and from the SDRAM under test, the oscilloscope display with a memory bus data signal DQ (102) and a memory bus clock signal DQS (104) from the SDRAM under test. The beneficial effect of driving (208) the oscilloscope display continually during both READ and WRITE operations while triggering the scope with a trigger signal based only one of READs or WRITEs but not both is illustrated and explained with reference to FIG. 6.

Figure 1:
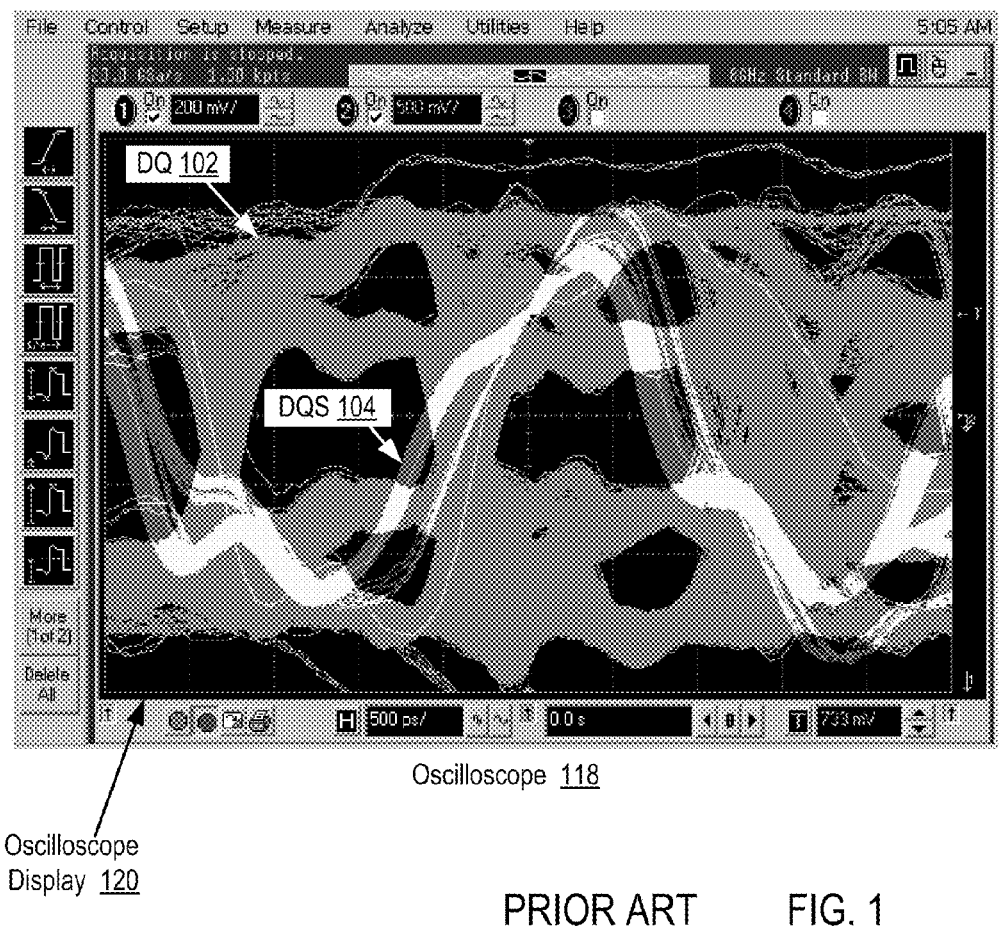
FIG. 1 sets forth a line drawing of a prior art test oscilloscope with an oscilloscope display upon which are shown test traces for DQ 102) and DQS.
Figure 6:
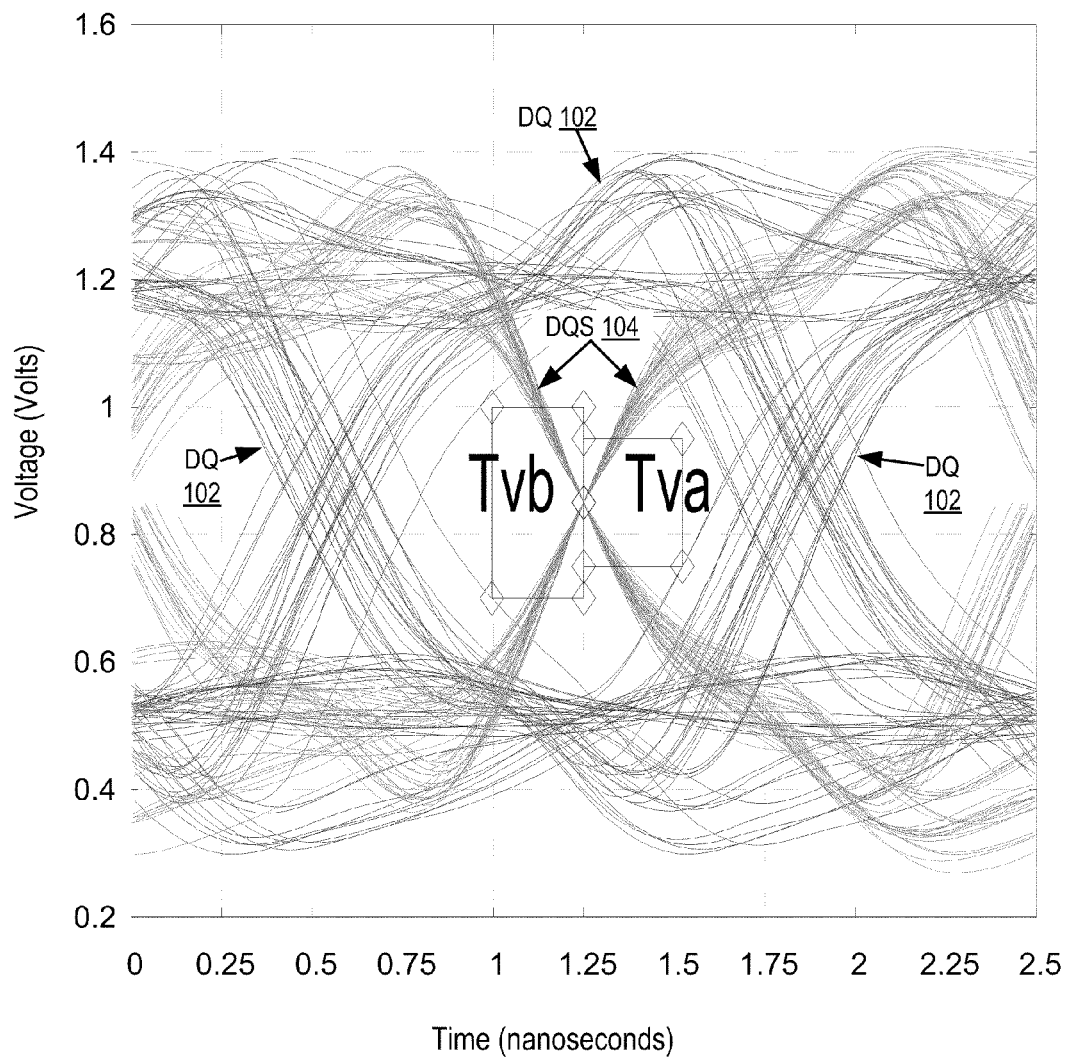
FIG. 6 sets forth a line drawing of an oscilloscope display upon which are measured SDRAM control signal timing according to embodiments of the present invention.

FIG. 6 sets forth a line drawing of an oscilloscope display upon which are shown test traces for DQ (102) and DQS (104) from an SDRAM under test by a test pattern that includes a continual sequence containing both READ operations and WRITE operations, and the oscilloscope display is triggered by a trigger signal derived from SDRAM control signals from a single type of memory operations. In this example, the trigger signal is combined from control signals derived only from WRITE operations—which we know because DQ (102) and DQS (104) are out of phase with one another. The result of SDRAM signal timing test according to embodiments of this invention is the clear, legible trace image illustrated in FIG. 6. $T_{VB}$ is the period of time during which DQ is valid before DQS becomes valid, and the $T_{VA}$ measurement is the period of time during which DQ is valid after DQS becomes invalid. Both quantities are part of the JEDEC SDRAM specification. Both quantities are easily seen in this trace to be about 0.25 nanoseconds. FIG. 6 invites comparison with FIG. 1. Using the trace of FIG. 1, the measurement is impossible. With the trace of FIG. 6, the measurement is easy—and the measurement includes any effects of bus turn around between READs and WRITEs.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of measuring control signal timing for synchronous dynamic random access memory ('SDRAM'), the method comprising:

combining into a trigger signal for an oscilloscope display control signals of an SDRAM under test, the control signals derived only from a single type of memory operations; and driving, continually during both READ and WRITE operations to and from the SDRAM under test, the oscilloscope display with a memory bus data signal ('DQ') and a memory bus clock signal ('DQS') from the SDRAM under test.

2. The method of claim 1 wherein the control signals comprise Chip Select ('CS'), Write Enable ('WE'), Column Address Strobe (CAS), and Row Address Strobe ('RAS').

3. The method of claim 1 further comprising adjusting the trigger signal for the latency effects of SDRAM access times by time-shifting the trigger signal.

4. The method of claim 3 wherein time-shifting the trigger signal further comprises time-shifting the trigger signal by a shift register.

5. The method of claim 1 wherein the single type of memory operations consists of READ operations, and combining the SDRAM control signals further comprises combining the SDRAM control signals according to: (NOT CS) AND RAS AND (NOT CAS) AND (NOT WE).

6. The method of claim 1 wherein the single type of memory operations consists of WRITE operations, and combining the SDRAM control signals further comprises combining the SDRAM control signals according to: (NOT CS) AND RAS AND (NOT CAS) AND WE.

7. The method of claim 1 wherein combining the control signals is carried out by combinatorial logic installed in a test probe.

8. The method of claim 1 wherein combining the control signals is carried out by combinatorial logic manufactured into the SDRAM under test.

9. Apparatus for measuring control signal timing for synchronous dynamic random access memory ('SDRAM'), the apparatus comprising:

combinatorial logic that combines into a trigger signal for an oscilloscope display control signals of an SDRAM under test, the control signals derived only from a single type of memory operations; and the oscilloscope display connected to the SDRAM under test so as to drive, continually during both READ and WRITE operations to and from the SDRAM under test, the oscilloscope display with a memory bus data signal ('DQ') and a memory bus clock signal ('DQS') from the SDRAM under test.

10. The apparatus of claim 9 wherein the control signals comprise Chip Select ('CS'), Write Enable ('WE'), Column Address Strobe (CAS), and Row Address Strobe ('RAS').

11. The apparatus of claim 9 further comprising a time shifting device connected between an output of the combinatorial logic and the oscilloscope display that adjusts the trigger signal for the latency effects of SDRAM access times by time-shifting the trigger signal.

12. The apparatus of claim 11 wherein the time shifting device further comprises a shift register.

13. The apparatus of claim 9 wherein the single type of memory operations consists of READ operations, and the combinatorial logic is configured to implement: (NOT CS) AND RAS AND (NOT CAS) AND (NOT WE).

14. The apparatus of claim 9 wherein the single type of memory operations consists of WRITE operations, and combinatorial logic is configured to implement: (NOT CS) AND RAS AND (NOT CAS) AND WE.

15. The apparatus of claim 9 wherein the combinatorial logic is installed in a test probe.

16. The apparatus of claim 9 wherein the combinatorial logic is manufactured into the SDRAM under test.

* * * * *